United States Patent [19]

Maruyama et al.

[11] Patent Number: 4,870,615
[45] Date of Patent: Sep. 26, 1989

[54] NONVOLATILE FLOATING GATE SEMICONDUCTOR MEMORY DEVICE

[75] Inventors: Tadashi Maruyama; Yukio Wada; Tomohisa Shigematsu; Yasoji Suzuki, all of Yokohama; Makoto Yoshizawa, Tokyo, all of Japan

[73] Assignee: Kabushiki Kaisha Toshiba, Kawasaki, Japan

[21] Appl. No.: 150,290

[22] Filed: Jan. 29, 1988

[30] Foreign Application Priority Data

Jan. 31, 1987 [JP] Japan .................................. 62-21088

[51] Int. Cl.⁴ ............................................. G11C 11/40
[52] U.S. Cl. .................................... 365/185; 357/23.5
[58] Field of Search ........................ 365/185; 357/23.5

[56] References Cited

U.S. PATENT DOCUMENTS

| | | | |
|---|---|---|---|
| 4,181,980 | 1/1980 | McCoy | 365/185 |
| 4,462,090 | 7/1984 | Iizuka | 365/185 |
| 4,558,344 | 12/1985 | Perlegos | 357/59 |
| 4,710,900 | 12/1987 | Higuchi | 365/185 |
| 4,725,983 | 2/1988 | Terada | 365/185 |
| 4,752,912 | 6/1988 | Guterman | 365/185 |

FOREIGN PATENT DOCUMENTS 0053075  6/1982  European Pat. Off. .
0183235  6/1986  European Pat. Off. .
0202785  11/1986  European Pat. Off. .

Primary Examiner—James W. Moffitt
Attorney, Agent, or Firm—Finnegan, Henderson, Farabow, Garrett, & Dunner

[57] ABSTRACT

A nonvolatile semiconductor memory device comprises a cell transistor formed of a floating gate type MOS transistor, for storing an electric charge, whose gate is connected to a control gate line layer, a first selecting transistor formed of an MOS transistor, whose gate is connected to a read gate line layer, whose source-drain path is connected at one end to a read line layer, and at the other end to one terminal of the source-drain path of the cell transistor, and a second selecting transistor formed of an MOS transistor, whose gate is connected to a write gate line layer, whose source-drain path is connected at one end to a write line layer, and at the other end to the other terminal of the source-drain path of a cell transistor. A power source voltage of 5 V can be supplied to the read line layer in the read mode.

40 Claims, 12 Drawing Sheets

| MODE | ERASE | WRITE | READ |
|---|---|---|---|
| BL | 0V | 20V | 1V |
| SG | 20V | 20V | 5V |
| CG | 20V | 0V | 0V |
| S | 0V | 5V | 0V |

| MODE | ERASE | WRITE | READ |
|---|---|---|---|
| WL | 0V | 20V | 0V |
| WG | 20V | 20V | 5V |
| CG | 20V | 0V | 0V |
| RG | 0V | 0V | 5V |
| RL | — | — | 5V |

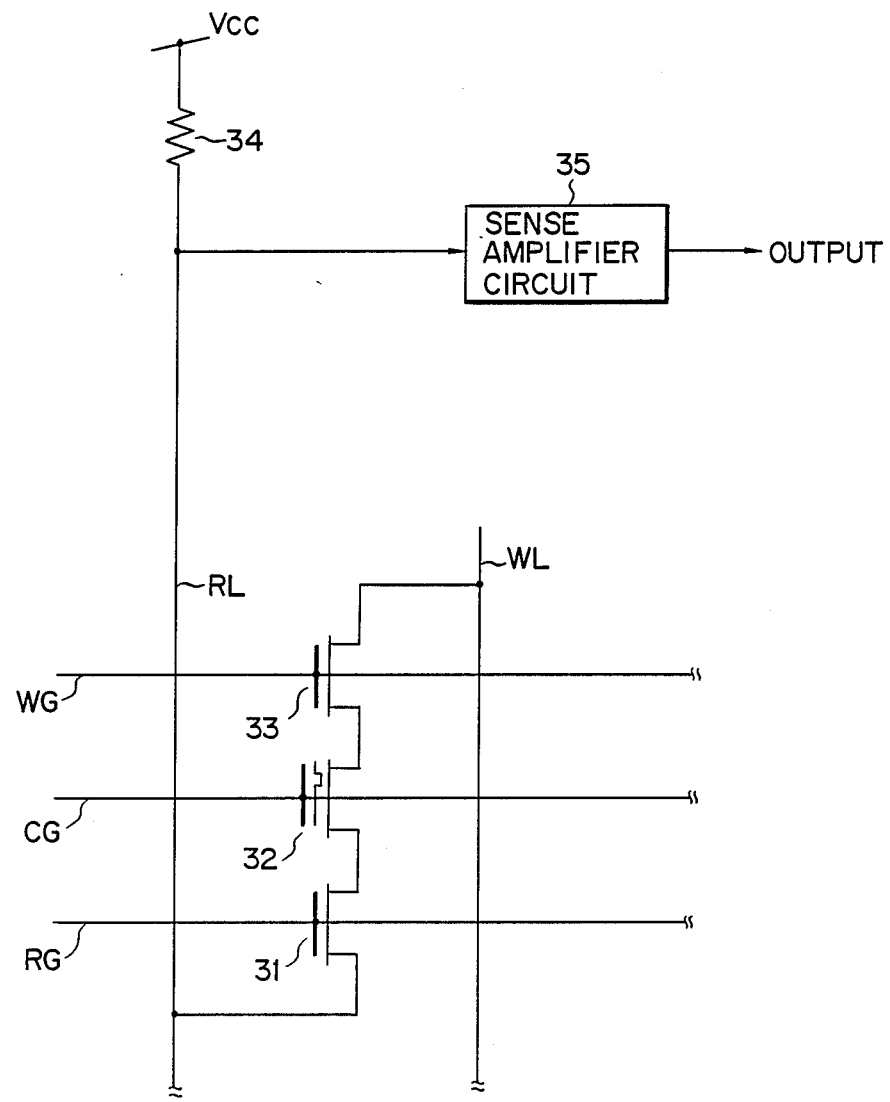
F I G. 7

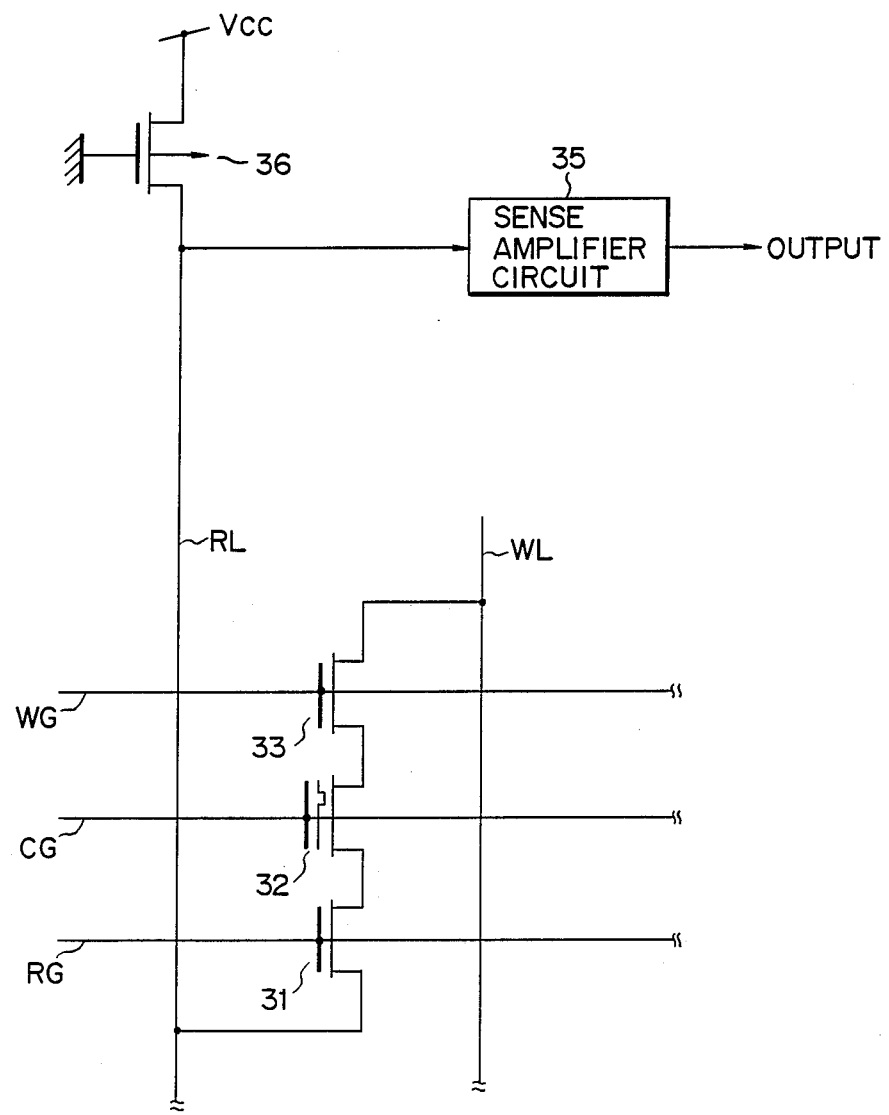
F I G. 8

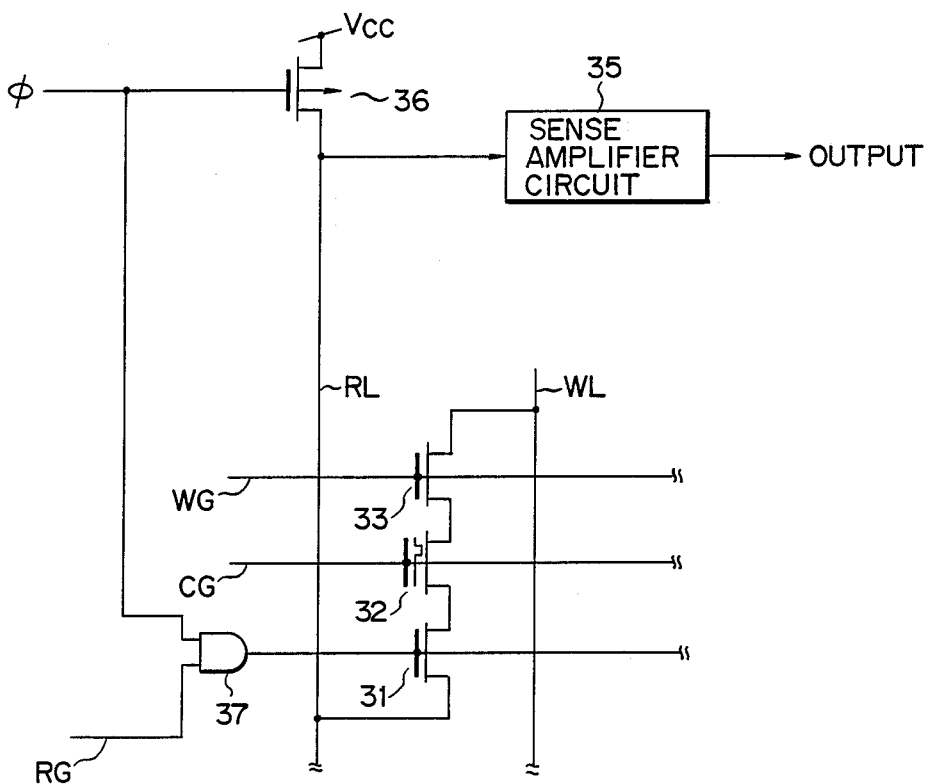
F I G. 11
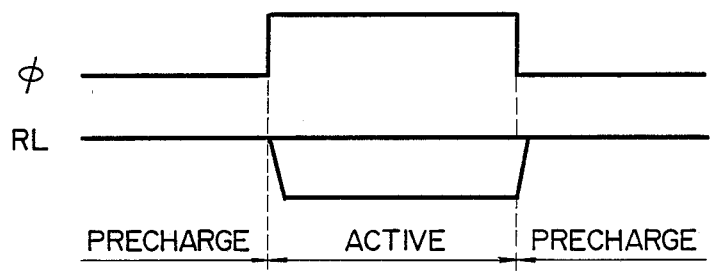
F I G. 12

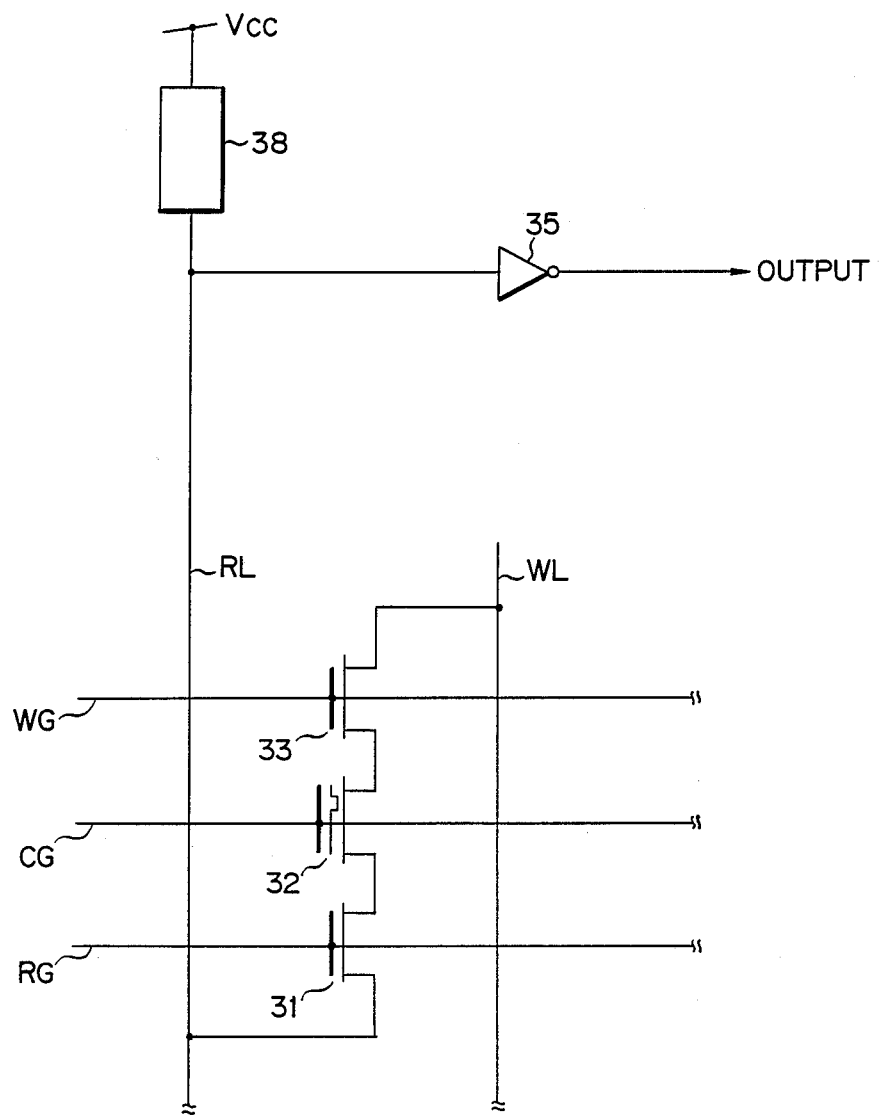
F I G. 13

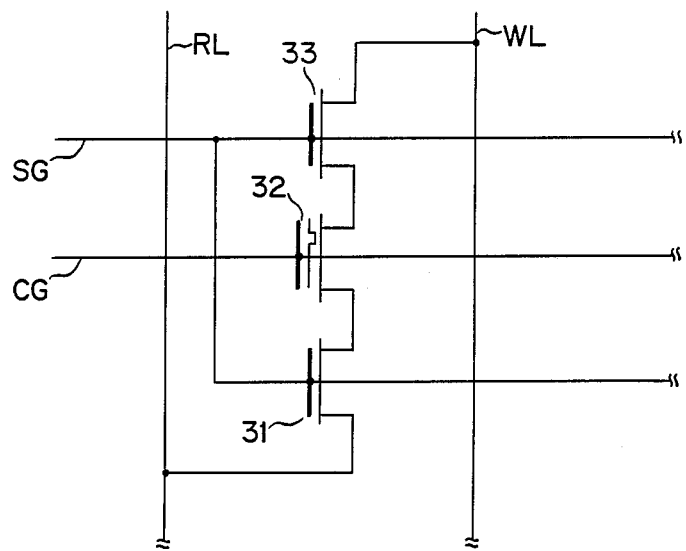
F I G. 14
| MODE | ERASE | WRITE | READ |
|---|---|---|---|
| WL | 0$^V$ | 20$^V$ | 0$^V$ |
| SG | 20$^V$ | 20$^V$ | 5$^V$ |
| CG | 20$^V$ | 0$^V$ | 0$^V$ |
| RL | 0$^V$ | 5$^V$ | 5$^V$ |
F I G. 15

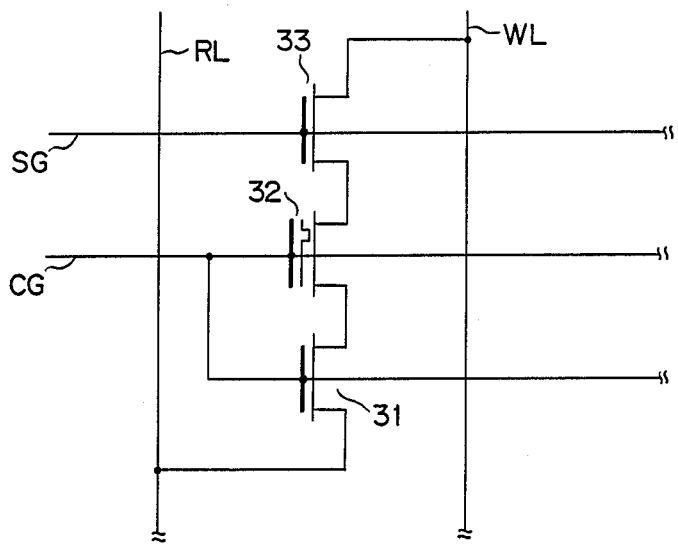
F I G. 16
| MODE | ERASE | WRITE | READ |
|---|---|---|---|
| WL | 0$^V$ | 20$^V$ | 0$^V$ |
| SG | 20$^V$ | 20$^V$ | 5$^V$ |
| CG | 20$^V$ | 0$^V$ | 5$^V$ |
| RL | 0$^V$ | — | 5$^V$ |
F I G. 17

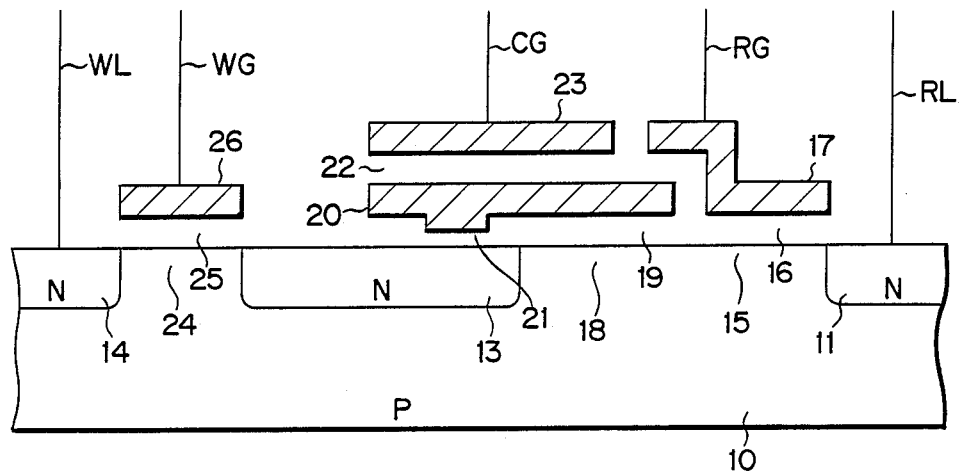
F I G. 18
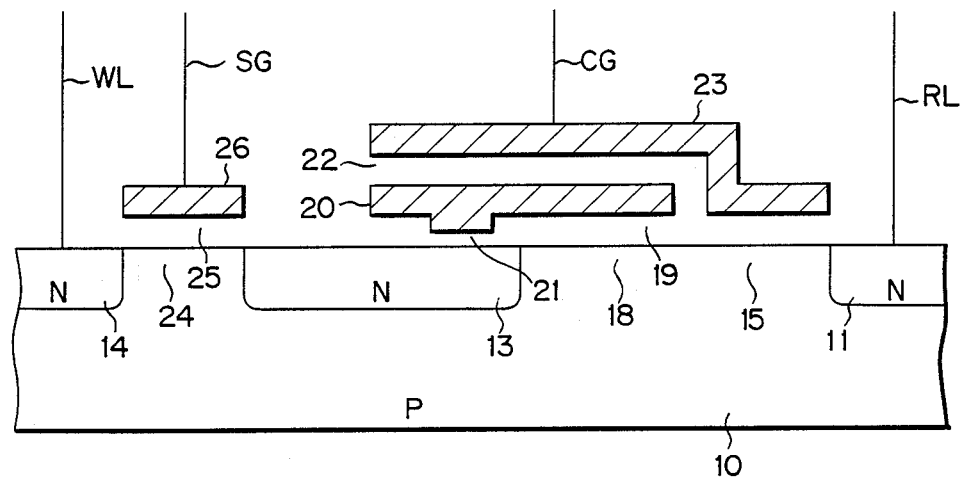
F I G. 19

NONVOLATILE FLOATING GATE SEMICONDUCTOR MEMORY DEVICE

BACKGROUND OF THE INVENTION

This invention relates to a nonvolatile semiconductor memory device comprising a nonvolatile transistor and allowing the stored data to be replaced by another data.

This type of nonvolatile semiconductor memory device is well known as an E²ROM (electrically erasable and programmable read only memory). One known memory cell for use in the E²PROM, is a floating gate type memory cell, in which the floating gate electrode partially overlaps a thin insulating film formed on the diffusion layer.

FIG. 1 is a sectional view showing the structure of a prior art memory cell of this type. N type diffusion layers 41, 42 and 43 are formed in the surface region of P type semiconductor substrate 40. Channel region 44 is formed between diffusion layers 41 and 42. A relatively thick insulating film 45 is formed on channel region 44. Electrode 46 made of polysilicon is formed on the insulating layer 45. Electrode 46 extends over N type diffusion layer 42. A portion of electrode 46 projects toward diffusion layer 42. Insulating film 47 exists between diffusion layer 42 and a portion of electrode 46. Insulating film 47 is thinner than insulating film 45. Insulating film 48 is formed on electrode 46. Electrode 49 made of polysilicon is formed on insulating film 48.

Channel region 50 is also formed between diffusion layers 42 and 43. Relatively thick insulating film 51 is formed on channel region 50. Further, electrode 52 made of polysilicon is formed on insulating film 51.

Source interconnection S is connected to diffusion layer 41, and bit line BL is connected to diffusion layer 43. Electrode 46 is used as a floating gate electrode, and electrode 49 is used as a control gate electrode, and electrode 52 is used as a gate electrode. Control gate electrode 49 is connected to control gate wire CG, and select gate wire SG is connected to gate electrode 52.

FIG. 2 shows an equivalent circuit of the prior art memory cell shown in FIG. 1. As is shown in the figure, transistor 61 is of the floating gate type in which diffusion layers 41 and 42 are a source and a drain, respectively. This transistor constitutes a memory transistor for storing data. Transistor 62 is of the MOS type in which diffusion layers 42 and 43 are a source and a drain, respectively. This transistor is for selecting memory transistor 61.

Operation modes of such memory cells includes a data-erase mode, a data-write mode and a data-read mode. FIG. 3 tabulates the voltages applied to source interconnection S, bit line BL, control gate wire CG, and selecting gate wire SG. Three types of power source voltages are used in the integrated circuit including the E²PROM: GND, Vcc and Vpp. GND=0 V, and Vcc=5 V. Power source voltage Vpp is not supplied from an external power supply, but formed by increasing the Vcc voltage in the IC circuit.

The data-erase mode will first be described. This mode is also called an electron injection mode. In the mode, electrons are injected into floating gate electrode 46 to increase the threshold voltage $V_{TH}$ of memory transistor 61. In this mode, BL=0 V, SG=20 V, CG=20 V, and S=0 V. By setting SG voltage at 20 V, selecting transistor 62 is turned on, and the potential at N type diffusion layer 42 becomes the BL potential, i.e., 0 V. Floating gate electrode 46 is coupled with a high voltage of CG, 20 V. Under this condition, a high electric field is applied to thin insulating film 47 formed between floating gate electrode 46 and N type diffusion layer 42. Consequently, floating gate electrode 46 is injected with electrons from N type diffusion layer 42 by a tunnel current. As a result, the threshold voltage $V_{TH}$ of memory transistor 61 increases to, for example, +8 V.

The data-write mode is called an electron-emission mode in which electrons injected into floating gate electrode 46 are discharged therefrom to decrease the threshold voltage $V_{TH}$ of memory transistor 61. In this mode, BL=20 V, SG=20 V, CG=0 V, and S=5 V. By setting SG at 20 V, selecting transistor 62 is turned on, and N type diffusion layer 42 becomes the BL potential, i.e., 20 V. Therefore, a high electric field whose direction is opposite to that of the erase mode, is applied to thin insulating film 47 Consequently, the electrons are discharged from floating gate electrode 46 to N type diffusion layer 42. As a result, the threshold voltage $V_{TH}$ of memory transistor 61 decreases to, for example, −5 V.

In the data-read mode, BL=1 V, SG=5 V, CG=0 V, and S=0 V. By setting SG at 5 V, selecting transistor 62 is turned on, and N type diffusion layer 42 becomes the BL potential, i.e., 1 V. At this time, if electrons have been injected into floating gate electrode 46, the threshold voltage of memory transistor 61 has been increased. Therefore, memory transistor 61 is kept turned off. No current flows through BL and S, and BL is kept at 1 V. On the other hand, if electrons have been emitted from floating gate electrode 46, the threshold voltage of memory transistor 61 has been descreased. Therefore, transistor 61 is turned on. At this time, a current flows from floating gate electrode 46 toward N type diffusion layer 42, and the potential of BL becomes the S potential, i.e., approximately 0 V. A potential difference between 1 V and 0 V on bit line BL is amplified by a sense amplifier (not shown) connected to bit line BL, to determine a logical "1" or a logical "0".

An existing problem arises from the fact that a small potential difference between 1 V and 0 V occurring on bit line BL is amplified by a sense amplifier. In other words, a small potential difference is used, in order to determine a logical "1" or a logical "0" by a sense amplifier.

The reason why the bit line voltage BL must be held at about 1 V, and not at large voltage 5 V, in the read mode, will be described. When BL=5 V, the voltage of N type diffusion layer 42 becomes approximately 5 V. Under this condition, an electric field, which is caused by CG=0 V and N type diffusion layer 42=5 V, is applied to thin insulating film 47. When the electric fields in the read and write modes are compared, the directions of the electric fields are the same, but the intensities are different. The electric field intensity in the read mode is lower than that in the write mode. Therefore, when electrons are injected into the cell transistor, and the cell transistor is subjected to the read mode for a long time, electrons are emitted from the cell transistor due to the tunnel effect with time, so that the threshold voltage of the cell transistor gradually drops. When a certain period of time has elapsed, an erroneous logical operation may be caused in the circuit. Such a phenomenon is called a "soft write" (weak write) phenomenon. The characteristic of the soft write phenomenon with respect to the time is called a read-retention characteristic (the data-retention characteristic in the read mode).

A possible way to improve the read-retention characteristic is to decrease the bit line voltage in the read mode. In this approach, however, a difference between the bit line potential when the electrons are being injected into the cell transistor and the bit line potential when electrons are emitted from the cell transistor, is small, to narrow the logical margin in the read mode. For this reason, the bit line potential in the read mode is limited to about 1 V.

On the other hand, to cope with the small logical margin problem, a high performance sense amplifier is designed. However, this causes some problems. A first problem resides in the complicated circuit of the sense amplifier. To fabricate such a complicated amplifier circuit into a semiconductor chip, a large area is required on the semiconductor chip, resulting in increase of cost of manufacture. A second problem resides in the reduced margin for the power source voltage in the read mode. This is undesirable for the low voltage operation. A third problem resides in the need for the constant voltage source of 1 V (intermediate voltage) to be supplied to the bit line. The prior art memory device must comprise a circuit for forming such an intermediate voltage, resulting in increase of power consumption. A fourth problem resides in a long access time due to the complicated structure of the sense amplifier.

As described above, the prior art nonvolatile memory device involves many problems; the large area required on the semiconductor chip, instable low voltage operation, large power consumption, and the long access time.

SUMMARY OF THE INVENTION

Accordingly, an object of this invention is to provide a nonvolatile memory device which is featured by low operation voltage, low power consumption, high operating speed, and the simple periphery circuitry including the sense amplifier.

According to the present invention, there is provided a nonvolatile semiconductor memory device comprising:
 a write line layer;
 a read line layer;
 a write gate line layer;
 a control gate line layer;
 a read gate line layer;
 a cell transistor formed of a floating gate type MOS transistor, for storing an electric charge, whose gate is connected to said control gate line layer;
 a first selecting transistor formed of an MOS transistor, whose gate is connected to said read gate line layer, one terminal of whose source-drain path is connected to said read line layer, and the other terminal of the source-drain path is connected to one terminal of the source-drain path of said cell transistor; and
 a second selecting transistor formed of an MOS transistor, whose gate is connected to said write gate line layer, one terminal of whose source-drain path is connected to said write line layer, and the other terminal of the source-drain path is connected to the other terminal of said source-drain path of said cell transistor.

According to the present invention, there is further provided a nonvolatile semiconductor memory device comprising:
 a semiconductor substrate o a first conductivity type;
 first to fourth diffusion layers of a second conductivity type formed in said substrate;
 a first channel region formed between said first and second diffusion layers;
 a second channel region formed between said second and third diffusion layers;
 a third channel region formed between said third and fourth diffusion layers;
 a first gate electrode formed above said first channel region;
 a floating gate electrode formed above said second channel region, and extending above said third diffusion layer;
 a control gate electrode formed above said floating gate electrode;
 a second gate electrode formed above said third channel region;
 a first insulating layer formed between said second channel region and said floating gate electrode;
 a second insulating layer formed between said third diffusion layer and said extending portion of said floating gate electrode, the second insulating layer having a thickness thinner than that of said first insulating layer;
 a write line layer for supplying a predetermined voltage to said fourth diffusion layer in data erase, write, and read modes;
 a write gate line layer for supplying a predetermined voltage to said second gate electrode in the data erase, write, and read modes;
 a control gate line layer for supplying a predetermined voltage to said control gate electrode in the data erase, write, and read modes;
 a read gate line layer for supplying a predetermined voltage to said first gate electrode in data erase, write, and read modes; and
 a read line layer for supplying a predetermined voltage to said first diffusion layer in the data erase, write, and read modes.

According to the present invention, these is still further provided a nonvolatile semiconductor memory device comprising:
 a semiconductor substrate of a first conductivity type;
 first to third diffusion layers of a second conductivity type formed in said substrate;
 first and second channel regions formed in series between said first and second diffusion layers;
 a third channel region formed between said second and third diffusion layers;
 a first gate electrode formed above said first channel region;
 a floating gate electrode formed above said second channel region, and extending above said second diffusion layer;
 a control gate electrode formed above said floating gate electrode;
 a second gate electrode formed above said third channel region;
 a first insulating layer formed between said second channel region and said floating gate electrode;
 a second insulating layer formed between said third diffusion layer and said extending portion of said floating gate electrode, the second insulating layer having a thickness thinner than that of said first insulating layer;
 a write line layer for supplying a predetermined voltage to said third diffusion layer in data erase, write and read modes;

a write gate line layer for supplying a predetermined voltage to said second gate electrode in data erase, write and read modes;

a control gate line layer for supplying a predetermined voltage to said control gate electrode in data erase, write and read modes;

a read gate line layer for supplying a predetermined voltage to said first gate electrode in data erase, write and read modes; and a read line layer for supplying a predetermined voltage to said first diffusion layer in data erase, write and read modes.

BRIEF DESCRIPTION OF THE DRAWINGS

FIG. 7 schematically shows a circuit diagram illustrating a general arrangement of an embodiment of a semiconductor memory device according to this invention;

FIG. 8 schematically shows a circuit diagram illustrating a general arrangement of another embodiment of a semiconductor memory device according to this invention;

FIG. 11 schematically shows a circuit diagram illustrating a general arrangement of a further embodiment of a semiconductor memory device according to this invention;

FIG. 12 shows a signal chart of the operation of the circuit shown in FIG. 11;

FIG. 13 shows a circuit diagram of a semiconductor memory device including a sense amplifier formed of an inverter and a memory cell;

FIG. 14 shows an equivalent circuit of an arrangement of a memory cell according to a modification of the memory cell shown in FIG. 4;

FIG. 15 shows a table denoting the voltages at various portions of the memory cell of FIG. 14 in the respective modes;

FIG. 16 shows an equivalent circuit of an arrangement of a memory cell according to another modification of the memory cell shown in FIG. 4;

FIG. 17 shows a table denoting the voltages at varies portions of the memory cell of FIG. 16 in the respective modes;

FIG. 18 shows a cross sectional view of a memory cell according to a modification of the memory cell shown in FIG. 4; and FIG. 19 shows a cross sectional view of a memory cell according to another modification of the memory cell shown in FIG. 4.

DETAILED DESCRIPTION OF THE PREFERRED EMBODIMENTS

Figure 1:
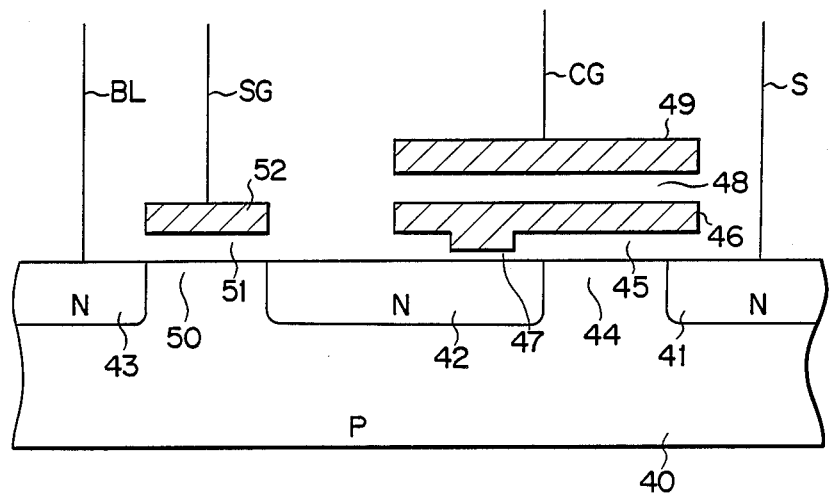
FIG. 1 is a cross sectional view showing the structure of a conventional memory cell used in a nonvolatile memory device.
Figures 2, 3:
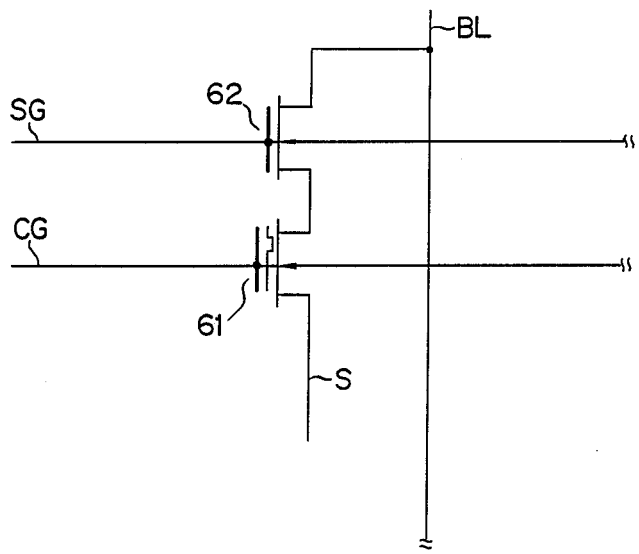
FIG. 2 is an equivalent circuit of the memory cell shown in FIG. 1.
FIG. 3 shows a table denoting the voltages at various portions in the respective modes of the memory cell of FIG. 1.
Figure 4:
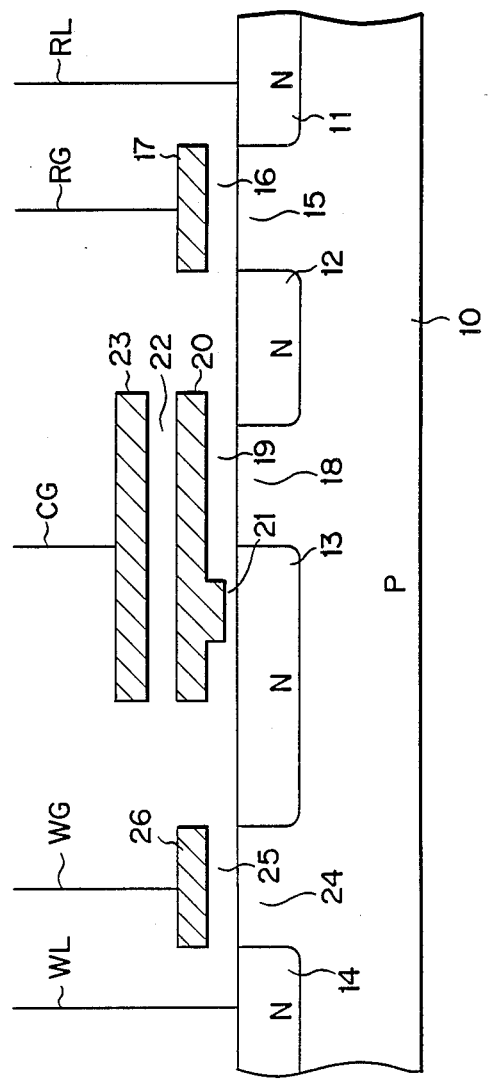
FIG. 4 is a cross sectional view showing the structure of a memory cell used in a nonvolatile semiconductor memory device according to this invention.

A memory cell used in a nonvolatile semiconductor memory device according to this invention is shown in FIG. 4. N type diffusion layers 11, 12, 13, and 14 are formed in the surface region of P type semiconductor substrate 10. Channel region 15 is formed between diffusion layers 11 and 12. Relatively thick insulating film 16 is formed on channel region 15. Electrode 17 made of polysilicon is formed on insulating film 16. Channel region 18 is formed between diffusion layers 12 and 13. Relatively thick insulating film 19 is also formed on channel region 18. Electrode 20 made of polysilicon is formed on insulating film 19. Electrode 20 extends over N type diffusion layer 13. A portion of extended electrode 20 projects toward diffusion layer 13. Insulating film 21 exists between diffusion layer 13 and the projected portion of extended electrode 20. The thickness of insulating film 21 is thinner than that of insulating film 19. The projected portion of extended electrode 20 is formed on insulating film 21. Insulating film 22 is formed on electrode 20. Electrode 23 made of polysilicon is formed on insulating film 22.

Channel region 24 is formed between diffusion layers 13 and 14. Relatively thick insulating film 25 is also formed on channel region 24. Electrode 26 made of polysilicon is formed on insulating film.

Read line RL is connected to diffusion layer 11, and write line WL is connected to diffusion layer 14. Electrodes 17 and 26 are used as gate electrodes; electrode 20 is used as a floating gate electrode; electrode 23 is used as a control gate electrode. Gate electrode 17 is connected to read gate line RG; control gate electrode 23 is connected to control gate line CG; gate electrode 26 is connected to gate line WG.

Figures 5, 6:
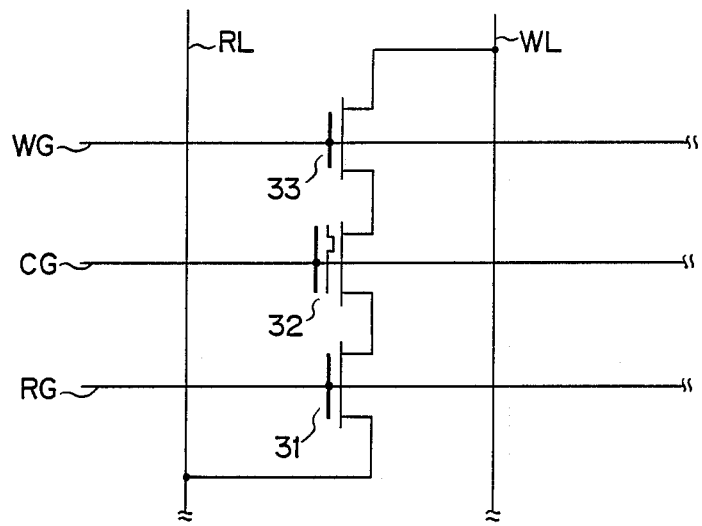
FIG. 5 is an equivalent circuit of the memory cell shown in FIG. 4.
FIG. 6 shows a table denoting the voltages at various portions in the respective modes of the memory cell of FIG. 4.

FIG. 5 shows an equivalent circuit of the cell of FIG. 4. In the figure, transistor 31 is of MOS type, in which diffusion layers 11 and 12 are used as a source and a drain, respectively. This transistor is a first selecting transistor for selecting a memory transistor. Transistor 32 is of floating gate type, in which diffusion layers 12 and 13 are used as a source and a drain, respectively This transistor is the memory transistor for storing data therein Transistor 33 is of MOS type, in which diffusion layers 13 and 14 are used as a source and a drain, respectively. This transistor serves as a second selecting transistor Operation modes of the memory cell of such structure includes data erase mode, data write mode, and data read mode, as in the case of the conventional memory cell. FIG. 6 tabulates the voltages supplied to read line WL, write gate line WG, control gate line CG, read gate line RG, and read line RL.

In the data erase mode (electron injection mode), those voltages are set such that WL=0 V, WG=20 V, CG=20 V, and RG=0 V. In this mode, any value of voltage may be set at read line RL By setting 20 V at WG, second selecting transistor 33 is turned on, so that N type diffusion layer 13 is at the WL potential, i.e , 0 V. The high voltage supplied to CG, i.e., 20 V, is applied to floating gate electrode 20. With 0 V supplied to RG, first selecting transistor 31 is turned off, and N type diffusion layer 12 is electrically in the floating state. As a result, a high electric field is applied to thin insulating film 21 formed between floating gate electrode 20 and N type diffusion layer 13. The electric field causes a tunnel current to flow, to inject electrons from N type diffusion layer 13 into floating gate electrode 20 Therefore, threshold voltage $V_{TH}$ of memory transistor 32 increases to, for example, +8 V.

In the data write mode (electron emission mode), WL=20 V, WG=20 V, CG=0 V, and RG=0 V. Also in this mode, the voltage supplied to read line RL may be set to any value. With 20 V supplied to WG, second selecting transistor 33 is turned on, so that N type diffusion layer 13 is at the WL potential, i.e., 20 V. As a result, a high electric field whose direction is opposite to that in the erase mode is applied to thin insulating film 21. The electric field causes a tunnel current to flow, to discharge the electrons from floating gate electrode 20 to N type diffusion layered 13. As a result, threshold voltage $V_{TH}$ of memory transistor 32 decreases to, for example, −5 V. The basic operations of the erase mode and the read modes substantially the same as those in the conventional memory cell.

In the read mode, WL=0 V, WG=5 V, CG=0 V, RG=5 V, and RL=5 V. By setting the voltages of RG and WG at 5 V, first and second selecting transistors 31 and 32 are turned on, and the potential of N type diffusion layer 12 is the RL potential, i.e., 5 V, and that of diffusion layer 13 is the potential of WL, 0 V. Under this condition, when electrons have been injected into floating gate electrode 20, threshold voltage $V_{TH}$ has been increased, and memory transistor 32 is not turned on. Accordingly, there is no current flow through read lines RL and WL, and RL is held at 5 V. When electrons have been emitted from floating gate electrode 20, threshold voltage $V_{TH}$ has been decreased, and memory transistor 32 is turned on. At this time, there is a current flow through read lines RL and WL, and RL becomes to the WL potential, i.e., approximately 0 V. A potential difference between 5 V and 0 V on read line RL is amplified by a sense amplifier (not shown), to determine a logical "1" or a logical "0".

It is noted here that the power source voltage of 5 V used can be supplied to read line RL in the read mode. It is further noted that even when the 5 V voltage is supplied to read line RL, the read retention characteristic can be remarkably improved, while suppressing the soft write phenomenon. The reason for this is as follows. In the read mode, WG=5 V and WL=0 V, and thus the voltage of N type diffusion layer 13 is 0 V. In short, CG=0 V, the voltage of floating gate electrode 20 is approximately at 0 V, and N type diffusion layer 13 is also 0 V. Under this condition, an electric field is not applied to the thin insulating film 21 formed between floating gate electrode 20 and N type diffusion layer 13. Therefore, the electron injection or emission by the tunnel effect does not occur.

FIG. 7 schematically shows a circuit diagram of a E²PROM device to which the nonvolatile semiconductor memory cell shown in FIGS. 4 and 5 is applied. In this figure, only one memory cell is shown for simplicity of illustration. The memory cell has first and second selecting transistors 31 and 32 and memory transistor 32. Resistor 34 as a load circuit is connected between read line RL and reading power source source Vcc. Read line RL is connected to the input terminal of sense amplifier 35.

Assuming that the resistance of resistor 34 is Rr, the resistance between RL and WL taken when electrons are charged into memory cell 32 is Roff, and resistance between RL and WL taken when electrons are discharged from memory cell 32 is Ron. Then, resistance Rr is selected as given below $$\text{Roff} \gg \text{Rr} \gg \text{Ron} \quad (1)$$

In this memory device, the voltage on read line RL is 5 V or 0 V depending on the electron injection or electron emission to or from memory cell 32. That is to say, the voltage on read line RL fully swings between 5 V and 0 V. Thus, if power source voltage Vcc is decreased, a satisfactory operation margin can be secured for the low voltage operation. Furthermore, the memory device of this invention does not require an intermediate voltage of 1 V, and hence, does not require a circuit for generating such voltage.

Now, let us consider the ranges of the voltages supplied to the memory device of the FIG. 7 in the erase, read and write modes, by referring to FIG. 6. The voltage ranges are: 0 V to 20 V (high voltage system) for WL, 5 V to 20 V (low and high voltage systems) for WG, 0 V to 20 V (high voltage system) for CG, 0 V to 5 V (low voltage system) of RG, and and 0 V to 5 V (low voltage system) for RL. Only WG uses both high voltage system and low voltage systems. Thus, the periphery circuits for processing these signals are simple. In short, the peripheral circuits can be separated between the high voltage system and the low voltage system, simplifying the circuit arrangement.

FIG. 8 schematically shows a circuit diagram of another embodiment of a semiconductor memory device according to this invention. In this memory device, P channel MOS transistor 36 is used as the load circuit of read line RL. Ground is connected to the gate electrode, so that transistor 36 is kept turned on. When conduction resistance of transistor 36 is Rr, the value of resistance Rr is selected so as to satisfy the relation (1).

Figure 9:
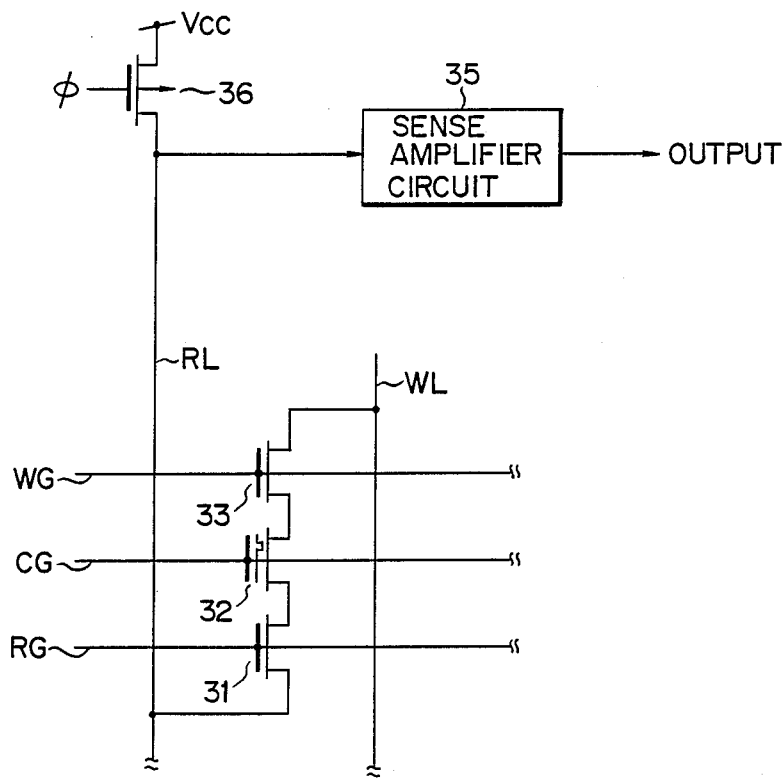
FIG. 9 schematically shows a circuit diagram illustrating a general arrangement of yet another embodiment of a semiconductor memory device according to this invention.
Figure 10:
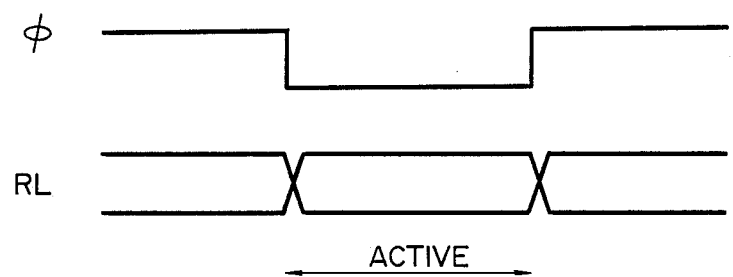
FIG. 10 shows a signal chart of the operation of the circuit shown in FIG. 9.

FIG. 9 shows yet another embodiment of a semiconductor memory device according to this invention. As in the case of FIG. 8, also in this instance, P channel MOS transistor 36 is used as the load circuit of read line RL. However, the gate electrode of transistor 36 is supplied with clock signal $\phi$. Transistor 36 is turned on when clock signal $\phi$ is at 0 V. Therefore, the active period of RL (i.e., a period that it is set at the Vcc level) is only during the period of $\phi=0$ V, as shown in a timing chart of FIG. 10.

With such an arrangement, the read current flowing from Vcc to WL through RL and the memory cell occurs only during the period of $\phi=0$ V. Thus, the power dissipation is further reduced.

FIG. 11 shows a circuit diagram showing an arrangement of a further embodiment of this invention. In this memory device, P channel MOS transistor 36 used as a load circuit of read line RL is coupled at the gate with clock signal $\phi$. The voltage of RG is applied not directly to, but via AND gate 37, to the gate electrode of transistor 31, under control of clock signal $\phi$.

FIG. 12 shows a timing chart for explaining the operation of the memory device shown in FIG. 11. When $\phi=0$ V, i.e., the precharge period is set, P channel MOS transistor 36 is turned on to precharge RL at Vcc. At this time, the output of AND gate 37 is at 0 V. Therefore, the first selecting transistor 31 supplied with an output of AND gate 37 is turned off, and thus, there is no current path routed from RL to the memory cell to WL.

When $\phi = 5$ V, the active period is set. During this period, P channel MOS transistor 36 is turned off. At this time, RG=5 V, and the output of AND gate 37 is also 5 V. Thus, first selecting transistor 31 is turned on. Under this condition, if electrons have been injected to memory cell 32, RL is kept at 5 V. If electrons have been emitted, RL is discharged to be 0 V.

As seen from the foregoing, there is no DC current path routed from Vcc via RL and the memory cell to WL. A further reduction of power dissipation can be realized.

FIG. 13 shows a circuit diagram of a memory device in which a sense amplifier is formed of an inverter. The load circuit 38 of read line RL may be formed of resistor 34 in FIG. 7, P channel MOS transistor 36 in FIG. 8 set in a normally-conductive state, P channel MOS transistor 36 controlled by clock signal $\phi$, or the like. In short, even when any load circuit is used between Vcc and RL, the voltage of RL fully swings between 0 V and 5 V. Thus, there is no need for a complicated sense amplifier for amplifying a minute potential difference. Therefore, an inverter can be used as sense amplifier 35, as shown in FIG. 13. The result is simplification of the sense amplifier and reduction of the access time.

FIG. 14 shows an equivalent circuit of a memory cell, which is a modification of this the memory cell shown in FIG. 4. In this memory cell according to this modification, the gate electrodes of first and second selecting transistors 31 and 33 are interconnected, the common gate electrode is connected to selecting gate line SG. In other words, this connection arrangement is substantially the same as that of the circuit of FIG. 5, except that the write gate line and the read gate line are interconnected and the interconnected line is used as selecting gate line SG. Therefore, this memory cell of FIG. 14 can be applied to the semiconductor devices shown in FIG. 7, 8, 9, 11, or 13.

FIG. 15 shows a table denoting the voltages supplied to write line WL, selecting gate line SG, control gate line CG, and read line RL in the respective modes of the memory cell shown in FIG. 4. The voltages supplied to selecting gate line SG are the same as those of write gate line WG in FIG. 6.

FIG. 16 shows an equivalent circuit of a memory cell according to a second modification of the memory cell shown in FIG. 4. As shown, the gate electrode of first select transistor 31 and the control gate electrode of memory transistor 32 are interconnected, and the interconnected electrode is connected to control gate line CG. In other words, this connection arrangement is substantially the same as that of the circuit of FIG. 5, except that the read gate line and control gate line CG are interconnected and the interconnected line is used as a common gate line CG.

FIG. 17 shows a table denoting the voltages supplied to write line WL, selecting gate line SG, control gate line CG, and read line RL in the respective modes of the memory cell shown in FIG. 16. First selecting transistor 31 is turned on in the data erase mode according to the CG voltage. However, if the voltage of RL is set to 0 V, no current flows through the source and drain of memory transistor 32, and no problem arises.

FIG. 18 shows a cross sectional view of a memory cell according to a further modification of the memory cell shown in FIG. 4. In the FIG. 4 cell, N type diffusion layer 12 is formed between channel regions 15 and 18. In this modification, however, no layer corresponding to the N type diffusion layer 12 is formed. Rather, channel regions 15 and 18 are formed in a series form between N type diffusion layers 11 and 13. The equivalent circuit of the memory cell having such structure is the same as that of the memory cell shown in FIG. 5. Therefore, it is possible to construct the memory devices shown by the equivalent circuits in FIGS. 7 to 9, and 11, by using the memory cell shown in FIG. 18. Further, the memory devices may be further modified as shown in FIG. 14 or 16.

FIG. 19 shows a cross sectional view of a memory cell according to a still further modification of the memory cell shown in FIG. 4. In this modification, a common layer is used for both the gate electrode formed above channel region 15 and control gate electrode 23, and the common electrode is used as control gate electrode 23. The equivalent circuit of this memory cell shown in FIG. 19 is the same as that shown in FIG. 16.

With such arrangements of the semiconductor memory device, a low operation voltage and a low power dissipation are realized. Further, the peripheral circuits including the sense amplifier are simplified in construction, and operable at a high speed.

We claim:

1. A nonvolatile semiconductor memory device comprising:
    a write line layer;
    a read line layer;
    a write gate line layer;
    a control gate line layer;
    a read gate line layer;
    a cell transistor, formed of a floating gate type MOS transistor having a source-drain path, for storing an electric charge, said cell transistor having a gate connected to said control gate line layer;
    a first selecting transistor, formed of an MOS transistor, having a gate connected to said read gate line layer, having a terminal of a source-drain path connected to said read line layer, and having the other terminal of the source-drain path connected to a first terminal of the source-drain path of said cell transistor; and
    a second selecting transistor formed of an MOS transistor comprising an impurity diffusion layer through which electrons are injected into a floating gate electrode of the floating gate type MOS transistor forming said cell transistor in a data erase mode and through while electrons are dissipated from said floating gate electrode of said cell transistor in a data write mode, said second selecting transistor having a gate connected to said write gate line layer, having one terminal of a source-drain path connected to said write line layer, and having another terminal of the source-drain path connected to the second terminal of said source-drain path of said cell transistor.

2. The memory device according to claim 1, in which said write gate line layer and said read gate line layer are interconnected with each other to form a selecting gate line.

3. The memory device according to claim 1, in which said read gate line layer and said control gate line layer are interconnected with each other to form a common gate line.

4. The memory device according to claim 1, in which said write line layer applies to said one terminal of said source-drain path of said second selecting transistor a first voltage in the data write mode, and a second voltage lower than said first voltage in the data erase and data read modes, said write gate line layer applies to said gate of said second selecting transistor said first voltage in the data erase and data write modes, and a third voltage lower than said first voltage and higher than said second voltage in the data read mode, said control gate line layer applies to said control gate of said cell transistor said first voltage in the data erase mode, and said second voltage in the data write and data read modes, said read gate line layer applies to said gate of said first selecting transistor said second voltage in the data erase and data write modes, and said third voltage in the data read mode; and said read line layer applies said third voltage to said one terminal of said source-drain path of said first selecting transistor in the data read mode.

5. The memory device according to claim 2, in which said write line layer applies to said one terminal of said source-drain path of said second selecting transistor a first voltage in the data write mode, and a second voltage lower than said first voltage in the data erase and data read modes, said selecting gate line layer applies to said gates of said first and second selecting transistors said first voltage in the data erase and data write modes, and a third voltage lower than said first voltage and higher than said second voltage in the data read mode, said control gate line layer applies to said control gate of said cell transistor said first voltage in the data erase mode, and said second voltage in the data write and data read modes, and said read line layer applies said third voltage to said one terminal of said source-drain path of aid first selecting transistor in the data write and data read modes.

6. The memory device according to claim 3, in which said write line layer applies to said one terminal of said source-drain path of said second selecting transistor a first voltage in the data write mode, and a second voltage lower than said first voltage in the data erase and data read modes, said common gate line layer applies to said gates of said first selecting transistor and said cell transistor said first voltage in the data erase mode, said second voltage in the data write mode, and a third voltage lower than said first voltage and higher than said second voltage in the data read mode, said write gate line layer applies to said gate of said second selecting transistor said first voltage in the data erase and data write modes, and said third voltage in the data read mode, and said read line layer applies to said one terminal of said source-drain path of said first selecting transistor said second voltage in the data erase mode, and said third voltage in the data read mode.

7. The memory device according to claim 1, in which said read line layer is connected to a power source via a load circuit, and a signal on the read line layer is supplied to a sense amplifier circuit.

8. The memory device according to claim 7, in which said load circuit comprises a MOS transistor which is normally turned on.

9. The memory device according to claim 7, in which said load circuit comprises a MOS transistor which is turned on by a clock signal.

10. The memory device according to claim 9, in which the voltage of said read gate line layer is supplied to said gate of said first selecting transistor in synchronism with said clock signal.

11. The memory device according to claim 7, in which said sense amplifier circuit is an inverter circuit.

12. The memory device according to claim 2, in which said read line layer is connected to a power source via a load circuit, and a signal on the read line layer is supplied to a sense amplifier circuit.

13. The memory device according to claim 12, in which said load circuit comprises a MOS transistor which is normally turned on.

14. The memory device according to claim 12, in which said load circuit comprises a MOS transistor which is turned on by a clock signal.

15. The memory device according to claim 14, in which the voltage of said selecting gate line layer is supplied to said gates of said first and second selecting transistors in synchronism with said clock signal.

16. The memory device according to claim 12, in which said sense amplifier circuit is an inverter circuit.

17. The memory device according to claim 3, in which said read line layer is connected to a power source via a load circuit, and a signal on the read line layer is supplied to a sense amplifier circuit.

18. The memory device according to claim 17, in which said load circuit comprises a MOS transistor which is normally turned on.

19. The memory device according to claim 17, in which said load circuit comprises a MOS transistor which is turned on by a clock signal.

20. The memory device according to claim 19, in which the voltage of said common gate line layer is supplied to said gates of said first selecting and cell transistors in synchronism with said clock signal.

21. The memory device according to claim 17, in which said sense amplifier circuit is an inverter circuit.

22. A nonvolatile semiconductor memory device comprising:
a semiconductor substrate of a first conductivity type;
first to fourth diffusion layers of a second conductivity type formed in said substrate;
a first channel region formed between said first and second diffusion layers;
a second channel region formed between said second and third diffusion layers;
a third channel region formed between said third and fourth diffusion layers;
a first gate electrode formed above said first channel region;
a floating gate electrode formed above said second channel region, and extending above said third diffusion layer;
a control gate electrode formed above said floating gate electrode;
a second gate electrode formed above said third channel region;
a first insulating layer formed between said second channel region and said floating gate electrode;
a second insulating layer formed between said third diffusion layer and said extending portion of said floating gate electrode, the second insulating layer having a thickness thinner than that of said first insulating layer;
a write line layer for supplying a predetermined voltage to said fourth diffusion layer in data erase, write, and read modes;
a write gate line layer for supplying a predetermined voltage to said second gate electrode in the data erase, write, and read modes;
a control gate line layer for supplying a predetermined voltage to said control gate electrode in the data erase, write, and read modes;

a read gate line layer for supplying a predetermined voltage to said first gate electrode in data erase, write, and read modes; and a read line layer for supplying a predetermined voltage to said first diffusion layer in the data erase, write, and read modes.

23. The memory device according to claim 22, in which said write line layer applies to said fourth diffusion layer a first voltage in the data write mode, and a second voltage lower than said first voltage in the data erase and data read modes, said write gate line layer applies to said second gate electrode said first voltage in the data erase and data write modes, and a third voltage lower than said first voltage and higher than said second voltage in the data read mode, said control gate line layer applies to said control gate electrode said first voltage in the data erase mode, and said second voltage in the data write and data read modes, said read gate line layer applies to said first gate electrode said second voltage in the data erase and data write modes, and said third voltage in the data read mode; and said read line layer applies said third voltage to said first diffusion layer in the data read mode.

24. The memory device according to claim 22, in which said read line layer is connected to a power source via a load circuit, and a signal on the read line layer is supplied to a sense amplifier circuit.

25. The memory device according to claim 24, in which said load circuit comprises a MOS transistor which is normally turned on.

26. The memory device according to claim 24, in which said load circuit comprises a MOS transistor which is turned on by a clock signal.

27. The memory device according to claim 26, in which the voltage of said read gate line layer is supplied to said first gate electrode in synchronism with said clock signal.

28. The memory device according to claim 24, in which said sense amplifier circuit is an inverter circuit.

29. The memory device according to claim 22, in which said write gate line layer and said read gate line layer are interconnected with each other.

30. The memory device according to claim 22, in which said control gate line layer and said read gate line layer are interconnected with each other.

31. A nonvolatile semiconductor memory device comprising:

a semiconductor substrate of a first conductivity type;

first to third diffusion layers of a second conductivity type formed in said substrate;

a third channel region formed between said second and third diffusion layers;

a floating gate electrode formed above said first channel region;

a floating gate electrode formed above said second channel region, and extending above and with a portion projected toward said second diffusion layer;

a control gate electrode formed above said floating gate electrode;

a second gate electrode formed above said third channel region;

a first insulating layer formed between said second channel region and said floating gate electrode;

a second insulating layer formed between said second diffusion layer and said projected portion of said floating gate electrode, the second insulating layer having a smaller thickness than said first insulating layer;

a write line layer for supplying a predetermined voltage to said third diffusion layer in the data erase, write and read modes of the memory device;

a write gate line layer for supporting a predetermined voltage to said second gate electrode in the data erase, write and read modes;

a control gate line layer for supplying a predetermined voltage to said control gate electrode in the data erase, write and read modes;

a read gate line layer for supplying a predetermined voltage to said first gate electrode in the data erase, write and read modes; and a read line layer for supplying a predetermined voltage to said first diffusion layer in the data erase, write and read modes.

32. The memory device according to claim 31, in which said write line layer applies to said third diffusion layer a first voltage in the data write mode, and a second voltage lower than said first voltage in the data erase and data read modes, said write gate line layer applies to said second gate electrode said first voltage in the data erase and data write modes, and a third voltage lower than said first voltage and higher than said second voltage in the data read mode, said control gate line layer applies to said control gate electrode said first voltage in the data erase mode, and said second voltage in the data write and data read modes, said read gate line layer applies to said first gate electrode said second voltage in the data erase and data write modes, and said third voltage in the data read mode; and said read line layer applies said third voltage to said first diffusion layer in the data read mode.

33. The memory device according to claim 31, in which said read line layer is connected to a power source via a load circuit, and a signal on the read line layer is supplied to a sense amplifier circuit.

34. The memory device according to claim 33, in which said load circuit comprises a MOS transistor which is normally turned on.

35. The memory device according to claim 33, in which said load circuit comprises a MOS transistor which is turned on by a clock signal.

36. The memory device according to claim 35, in which the voltage of said read gate line layer is supplied to said first gate electrode in synchronism with said clock signal.

37. The memory device according to claim 33, in which said sense amplifier circuit is an inverter circuit.

38. The memory device according to claim 31, in which said write gate line layer and said read gate line layer are interconnected with each other.

39. The memory device according to claim 31, in which said control gate line layer and said read gate line layer are interconnected with each other.

40. The memory device according to claim 31, in which said first gate electrode and said control gate electrode are interconnected with each other.

* * * * *